(12) United States Patent
Rapp et al.

(10) Patent No.: US 6,534,706 B1
(45) Date of Patent: Mar. 18, 2003

(54) EMI SHIELD HAVING FLEXIBLE FINGERS WITH NONLINEAR SLITS

(75) Inventors: Martin L. Rapp, Grover, MO (US); Joseph J. Kaplo, Hampton, NH (US)

(73) Assignee: Amesbury Group, Inc., Amesbury, MA (US)

( * ) Notice: Subject to any disclaimer, the term of this patent is extended or adjusted under 35 U.S.C. 154(b) by 0 days.

(21) Appl. No.: 09/530,406

(22) PCT Filed: Oct. 30, 1998

(86) PCT No.: PCT/US98/23058
§ 371 (c)(1),
(2), (4) Date: Aug. 3, 2000

(87) PCT Pub. No.: WO99/23863
PCT Pub. Date: May 14, 1999

Related U.S. Application Data

(63) Continuation of application No. 08/962,417, filed on Oct. 31, 1997, now Pat. No. 6,294,729.

(51) Int. Cl.[7] ............................................... H05K 9/00
(52) U.S. Cl. .............................. 174/35 GC; 174/35 R
(58) Field of Search ................... 174/35 GC, 35 R; 361/816, 818, 800; 439/607, 608, 609, 610

(56) References Cited

U.S. PATENT DOCUMENTS

| | | | |
|---|---|---|---|
| 2,756,468 A | 7/1956 | Bright | 20/69 |
| 3,277,230 A | 10/1966 | Stickney et al. | 174/35 GC |
| 3,446,906 A | 5/1969 | Zulauf | 174/35 GC |
| 3,502,784 A | 3/1970 | Kunkel | 174/35 GC |
| 3,504,095 A | 3/1970 | Roberson et al. | 174/35 GC |
| 3,512,946 A | 5/1970 | Hutkin | 29/195 |
| 3,700,368 A | 10/1972 | Wells | 425/115 |
| 3,889,043 A | 6/1975 | Ducros | 174/35 GC |
| 4,399,317 A | 8/1983 | Van Dyk, Jr. | 174/35 GC |
| 4,434,541 A | 3/1984 | Powers, Jr. | 29/526 R |
| 4,572,921 A | 2/1986 | May | 174/35 GC |
| 4,857,668 A | 8/1989 | Buonanno | 174/35 GC |

(List continued on next page.)

FOREIGN PATENT DOCUMENTS

JP 10224073 8/1998 ............ H05K/9/00

OTHER PUBLICATIONS

*Electromagnetic Shielding Products and Thermally Conductive Insulators*; Warth catalog, front and back covers and pp. 34–79; Copyright Warth International Ltd. (1995).
*Foam Tite EMI Shielding Gaskets*; Advanced Performance Materials spec.sheet, double sided, (Jul. 1997).
*Foam–Tite M60 EMI Shielding Gasket*; Advanced Performance Materials spec.sheet, double sided, (May 1997).
*Foam–Tite 100 EMI Shielding Gasket*; Advanced Performance Materials spec.sheet, double sided, (May 1997).

*Primary Examiner*—Hung V. Ngo
(74) *Attorney, Agent, or Firm*—Testa, Hurwitz & Thibeault, LLP

(57) ABSTRACT

An electromagnetic interference shield for use around access panels and doors in electronic equipment enclosures includes a base and profile manufactured from an electrically nonconductive solid material such as a thermoplastic resin polymer. An electrically conductive layer of a metallized fabric is bonded to the profile to provide effective shielding and grounding function. The underlying polymer provides elastic compliancy and resiliency to the shield. The shield may be divided into flexible fingers which can be rectangular or nonlinear shaped. The nonlinear shaped flexible finger from nonlinear shaped slits between the fingers which provides improved EMI shielding by reducing the amount of EMI transmission that can pass through the shield. The electromagnetic interference shield may also be made from an electrically conductive material.

11 Claims, 6 Drawing Sheets

U.S. PATENT DOCUMENTS

| | | | | |
|---|---|---|---|---|
| 4,864,076 A | | 9/1989 | Stickney | 174/35 GC |
| 4,900,618 A | | 2/1990 | O'Connor et al. | 428/328 |
| 4,910,072 A | | 3/1990 | Morgan et al. | 428/212 |
| 5,043,528 A | * | 8/1991 | Mohr | 174/35 GC |
| 5,070,216 A | | 12/1991 | Thornton | 174/35 GC |
| 5,075,037 A | | 12/1991 | Morgan et al. | 252/513 |
| 5,082,734 A | | 1/1992 | Vaughn | 428/411.1 |
| 5,120,903 A | | 6/1992 | Tam | 174/35 GC |
| 5,142,101 A | | 8/1992 | Matsuzaki et al. | 174/35 GC |
| 5,275,861 A | | 1/1994 | Vaughn | 428/76 |
| 5,348,574 A | | 9/1994 | Tokas et al. | 106/1.11 |
| 5,393,928 A | | 2/1995 | Cribb et al. | 174/36 |
| 5,458,955 A | | 10/1995 | Vaughn et al. | 428/212 |
| 5,467,254 A | | 11/1995 | Brusati et al. | 361/799 |
| 5,483,423 A | | 1/1996 | Lewis et al. | 361/816 |
| 5,511,798 A | | 4/1996 | Kawamoto et al. | 277/205 |
| 5,522,602 A | | 6/1996 | Kaplo et al. | 277/53 |
| 5,569,877 A | | 10/1996 | Yumi | 174/35 GC |
| 5,581,048 A | * | 12/1996 | Shores | 174/35 GC |
| 5,600,544 A | | 2/1997 | Thalhammer | 361/816 |
| 5,646,369 A | | 7/1997 | Miska et al. | 174/35 GC |
| 5,656,795 A | | 8/1997 | Miska | 174/35 GC |
| 5,672,844 A | | 9/1997 | Persson et al. | 174/35 R |
| 5,679,923 A | | 10/1997 | Le | 174/35 R |
| 5,703,762 A | | 12/1997 | Zell et al. | 361/816 |
| 5,712,449 A | | 1/1998 | Miska et al. | 174/35 GC |

* cited by examiner

EMI SHIELD HAVING FLEXIBLE FINGERS WITH NONLINEAR SLITS

CROSS-REFERENCE TO RELATED APPLICATION

This application is a national stage application of International Application PCT/US98/23058, filed Oct. 30, 1998 (published in English under PCT Article 21(2) on May 14,1999 as WO 99/23863), which is a continuation of U.S. application Ser. No. 08/962,417, filed Oct. 31, 1997 (now U.S. Pat. No. 6,294,729, issued Sep. 25, 2001).

TECHNICAL FIELD

The present invention relates to electromagnetic interference ("EMI") shields and, more specifically, to EMI finger shields forming nonlinear slits between adjacent fingers, whether the shields are manufactured from metal or from an electrically nonconductive material and clad with an electrically conductive layer.

BACKGROUND

During normal operation, electronic equipment generates undesirable electromagnetic energy that can interfere with the operation of proximately located electronic equipment due to EMI transmission by radiation and conduction. The electromagnetic energy can by of a wide range of wavelengths and frequencies. To minimize the problems associated with EMI, sources of undesirable electromagnetic energy may be shielded and electrically grounded. Shielding is designed to prevent both ingress and egress of electromagnetic energy relative to a housing or other enclosure in which the electronic equipment is disposed. Since such enclosures often include gaps or seams between adjacent access panels and around doors, effective shielding is difficult to attain because the gaps in the enclosure permit transference of EMI therethrough. Further, in the case of electrically conductive metal enclosures, these gaps can inhibit the beneficial Faraday Cage Effect by forming discontinuities in the conductivity of the enclosure which compromise the efficiency of the ground conduction path through the enclosure. Moreover, by presenting an electrical conductivity level at the gaps that is significantly different from that of the enclosure generally, the gaps can act as slot antennae, resulting in the enclosure itself becoming a secondary source of EMI.

Specialized EMI gaskets have been developed for use in gaps and around doors to provide a degree of EMI shielding while permitting operation of enclosure doors and access panels. To shield EMI effectively, the gasket should be capable of absorbing or reflecting EMI as well as establishing a continuous electrically conductive path across the gap in which the gasket is disposed. Conventional metallic gaskets manufactured from copper doped with beryllium are widely employed for EMI shielding due to their high level of electrical conductivity. Due to inherent electrical resistance in the gasket, however, a portion of the electromagnetic field being shielded induces a current in the gasket, requiring that the gasket form a part of an electrically conductive path for passing the induced current flow to ground. Failure to ground the gasket adequately could result in radiation of an electromagnetic field from a side of the gasket opposite the primary EMI field.

In addition to the desirable qualities of high conductivity and grounding capability, EMI gaskets should be elastically compliant and resilient to compensate for variable gap widths and door operation, yet tough to withstand repeated door closure without failing due to metal fatigue. EMI gaskets should also be configured to ensure intimate electrical contact with proximate structure while presenting minimal force resistance per unit length to door closure, as the total length of an EMI gasket to shield a large door can readily exceed several meters. It is also desirable that the gasket be resistant to galvanic corrosion which can occur when dissimilar metals are in contact with each other for extended periods of time. Low cost, ease of manufacture, and ease of installation are also desirable characteristics for achieving broad use and commercial success.

Conventional metallic EMI gaskets, often referred to as copper beryllium finger strips, include a plurality of cantilevered or bridged fingers forming linear slits therebetween. The fingers provide spring and wiping actions when compressed. Other types of EMI gaskets include closed-cell foam sponges having metallic wire mesh knitted thereover or metallized fabric bonded thereto. Metallic wire mesh may also be knitted over silicone tubing. Strips of rolled metallic wire mesh, without foam or tubing inserts, are also employed.

One problem with metallic finger strips is that to ensure a sufficiently low door closure force, the copper finger strips are made from thin stock, for example on the order of about 0.05 mm (0.002 inches) to about 0.15 mm (0.006 inches) in thickness. Accordingly, sizing of the finger strip uninstalled height and the width of the gap in which it is installed must be controlled to ensure adequate electrical contact when installed and loaded, yet prevent plastic deformation and resultant failure of the strip due to overcompression of the fingers. To enhance toughness, beryllium is added to the copper to form an alloy; however, the beryllium adds cost. Finger strips are also expensive to manufacture, in part due to the costs associated with procuring and developing tooling for outfitting presses and rolling machines to form the complex contours required. Changes to the design of a finger strip to address production or performance problems require the purchase of new tooling and typically incur development costs associated with establishing a reliable, high yield manufacturing process. Notwithstanding the above limitations, metallic finger strips are commercially accepted and widely used. Once manufacturing has been established, large quantities of finger strips can be made at relatively low cost.

Metallic mesh and mesh covered foam gaskets avoid many of the installation disadvantages of finger strips; however, they can be relatively costly to produce due to the manufacturing controls required to realize acceptable production yields.

Another problem with conventional finger strips is that they are not as effective in EMI shielding as clock speed of an electronic product is increased. As clock speed is increased, the wavelength of the EMI waves produced decreases. Accordingly, the waves can penetrate smaller and smaller apertures in the enclosure and in the EMI shield. At lower wavelengths, the slits formed in the finger shields can act as slot antennae, permitting the passage of EMI therethrough and the resultant shielding effectiveness of the shields decreases. Conventional finger strips with linear slits formed between the fingers are increasingly less effective in these applications.

SUMMARY OF THE INVENTION

A metallized fabric clad polymer EMI shield overcomes many of the limitations and disadvantages of conventional EMI shields. One method of manufacturing a metallized fabric clad polymer shield for shielding EMI from passing through a seam between first and second electrically conductive bodies includes forming a base and a profile of an electrically nonconductive solid material in a predetermined configuration. The base is designed to secure the shield to the first body while the profile is designed to contact the second body. An electrically conductive layer is then disposed on at least part of the profile so as to be interdisposed between the profile and the second body upon installation of the shield in a suitable gap of an electronic enclosure. In one exemplary embodiment, the profile and base may be an extrusion of a polymer such as polyvinyl chloride ("PVC"), a thermoplastic resin, and the conductive layer may be a metallized fabric bonded to the profile by a heat sensitive glue. The forming and deposition processes may be separate or may be substantially contiguous. After extrusion and cooling of the profile and base, the metallized fabric may be bonded to the profile in a separate operation. Alternatively, by employing an in-line crosshead extrusion method, the polymer base and profile may be formed and substantially immediately thereafter, the metallized fabric applied as a thermally activated glue-backed tape. Resultant thermal energy in the extrusion activates the glue on the fabric side of the tape, bonding the metallized fabric to the profile. As a subsequent step in either manufacturing method, the profile may be divided into a plurality of independently flexible cantilevered or bridged fingers to compensate for variable gap width along the length of the gap.

Another embodiment for manufacturing a metallized fabric clad polymer EMI shield according to the invention includes disposing an electrically conductive layer on an electrically nonconductive solid sheet material and then forming the sheet into a base and a profile of a predetermined configuration. The sheet may be a polymer such as PVC, the conductive layer may be a metallized fabric bonded to the sheet by a thermally activated glue, and the profile and base may be formed by a thermal process such as thermoforming. As a subsequent step in the manufacturing method, the profile may be divided into a plurality of independently flexible cantilevered or bridged fingers.

According to certain embodiments of the invention, a metallized fabric clad polymer shield for shielding EMI from passing through a seam between first and second electrically conductive bodies includes a base for securing the shield to the first body, a profile of an electrically nonconductive solid material attached to the base for contacting the second body, and an electrically conductive layer disposed on the profile.

The base and the profile may be formed integrally of the same material by extrusion or of different materials by co-extrusion. Alternatively, the base and the profile may be similar or distinct materials joined together by bonding. Additionally, a hinge of a material exhibiting different flexural characteristics may be disposed between the base and the profile, either by co-extrusion or bonding. As used herein, the term bonding includes chemical processes such as those using glues or solvents, as well as mechanical processes such as friction welding and interlocking mechanical cross-sections.

To facilitate installing the EMI shield in an enclosure, an adhesive strip may be attached to the base. Alternatively, the base may include apertures for mechanical fasteners or a return for insertion in a slot or for capturing a flange of the first body. The return may also include barbing to stabilize the shield once installed.

Further EMI shield effectiveness may be achieved using nonlinear shaped EMI shielding fingers forming nonlinear slits therebetween. Various embodiments of nonlinear fingers and slits are contemplated, including those which are arcuate, sinusoidal, interdigitated, chevron-shaped, and combinations thereof. By using nonlinear fingers, the slits formed between the fingers do not form linear apertures so that EMI transmission in a given direction cannot line up with an entire slit length, but only a limited portion of the slit length. For arcuate and sinusoidal slits, as the radius of curvature is decreased, in the limit, the wavelength of EMI waves capable of passing through the slits approaches slit width, which can be substantially zero.

In one embodiment, the EMI shielding fingers with nonlinear slits may be manufactured out of an electrically conductive material such as a copper beryllium alloy or other metallic material. In another embodiment, the NM shielding fingers with nonlinear slits may be manufactured out of a metallized fabric clad polymer or other coated or clad material composition. In general, the nonlinear slits may be employed in any EMI finger shield, regardless of the material and method of manufacture, providing greatly improved EMI shielding effectiveness for short and very short wavelength radiation.

BRIEF DESCRIPTION OF THE DRAWINGS

The invention, in accordance with preferred and exemplary embodiments, together with further advantages thereof, is more particularly described in the following detailed description taken in conjunction with the accompanying drawings in which.

DETAILED DESCRIPTION

Figure 1B:
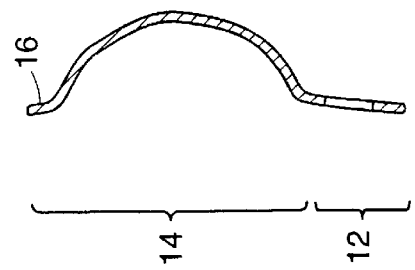
FIG. 1B is a schematic sectional view of the EMI shield depicted in FIG. 1A taken along line 1B—1B.
Figure 1A:
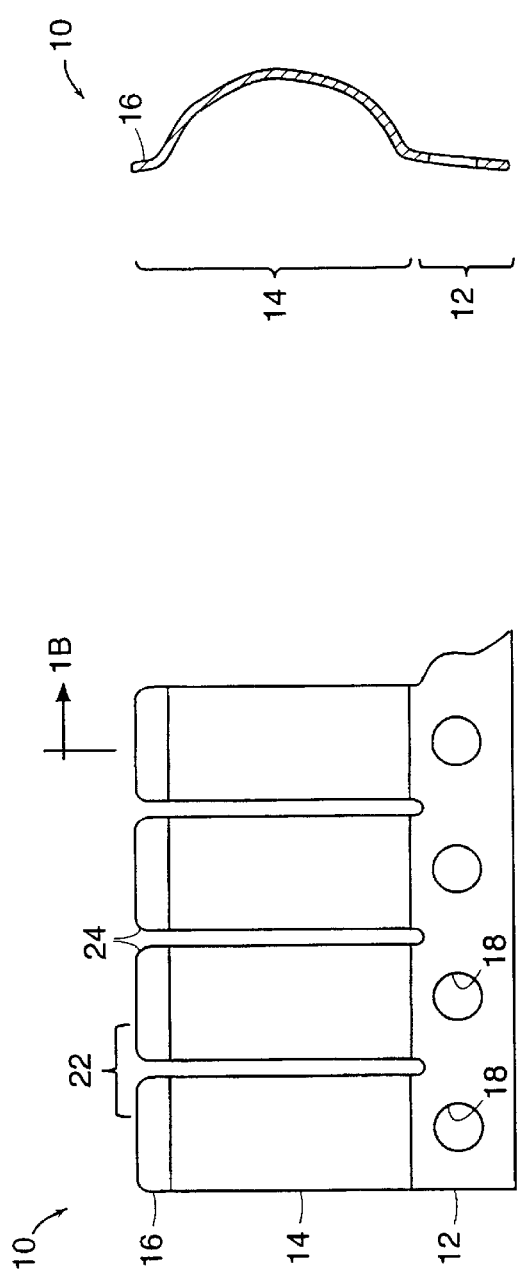
FIG. 1A is a schematic plan view of a portion of an EMI shield in accordance with one embodiment of the present invention.

FIGS. 1A and 1B are schematic plan and sectional views, respectively, of a metallized fabric clad polymer EMI shield 10 in accordance with one embodiment of the present invention. The shield 10 is formed from an electrically nonconductive solid material to produce a substantially planar base 12 and a generally arcuate profile 14 having an offset tip 16. The base 12 is configured with a series of apertures 18 so that the base 12 can be secured to a first body (not depicted) by a plurality of nuts and bolts, self-tapping machine screws, rivets, or other mechanical fasteners.

Figure 1C:
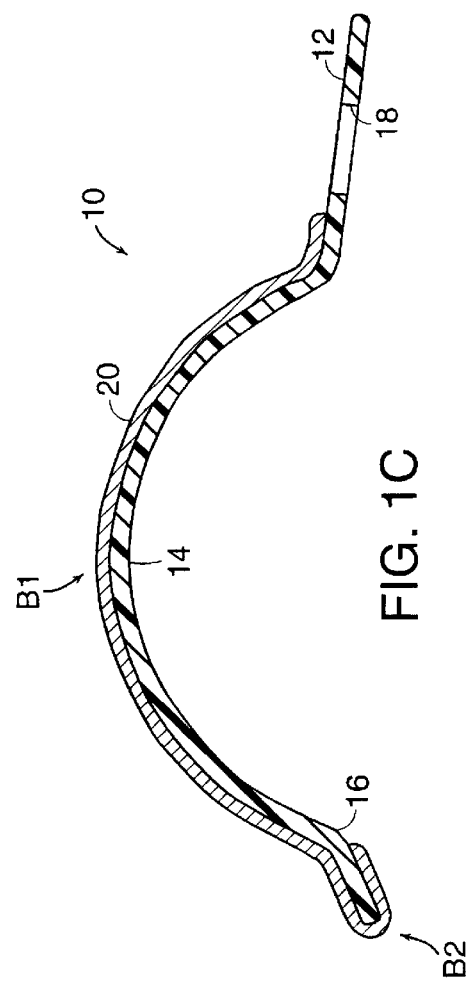
FIG. 1C is an enlarged view of FIG. 1B rotated counterclockwise ninety degrees and including the metallized fabric.

Referring now to FIG. 1C, an enlarged sectional view of the EMI shield 10 is depicted, including an electrically conductive layer of metallized fabric 20 disposed on the profile 14. The relative thicknesses of the fabric 20 and the profile 14 in this and other embodiments are for illustrative purposes only. In some embodiments, as will be discussed in greater detail hereinbelow, the thickness of the fabric 20 is typically substantially less than that of the profile 14. The metallized fabric 20 is bonded to the profile 14 with the fabric portion proximate the profile 14 and the metallic portion remote therefrom. The fabric 20 extends from the base 12 proximate the aperture 18 along the profile 14 and wraps around the offset tip 16. Accordingly, when the EMI shield 10 is compressed between first and second bodies at contact zones shown generally as arrows B1 and B2, the fabric provides an electrically conductive path therebetween. Since the EMI shield 10 is secured to the first body solely at the base 12 in a bridge configuration, the tip 16 is free to slide across the first body as the profile 14 is compressed by the second body. By offsetting the tip 16 slightly, the tip 16 slides readily over imperfections in the surface of the first body. Accordingly, the profile 14 elastically deforms during compressive loading, such as when the door is closed, instead of being jammed and crushed.

As is apparent from the depiction in FIG. 1C, the plane of the base 12 is offset from an end of the tip 16 so that when the EMI shield 10 is secured to the first body, a predetermined elastic deformation of the profile 14 results. This preloading of the EMI shield 10 ensures that the tip 16 remains in intimate contact with the first body, thereby providing a positive electrical ground path. In other embodiments, the fabric 20 may extend along the base 12 covering the aperture 18 so that a redundant electrical ground path exists when a fastener such as an aluminum rivet passes through the fabric and aperture, securing the EMI shield 10 to the first body. In yet another embodiment, the fabric may extend further, wrapping around the base 12 so that the fabric 20 is captured between the base 12 and the first body thereby providing a more positive electrical ground path. For any of these embodiments, the fabric 20 may stop short of the tip 16 or need not wrap around the tip 16, if desired.

Referring again to FIG. 1A, the profile 14 of the EMI shield 10 may be divided at regular intervals into a plurality of independently flexible fingers 22, each extending from the common base 12. By subdividing the profile 14 in this manner, the EMI shield 10 can provide effective shielding in a gap which varies in width along its length. Reliefs 24 may be provided at the corners of the fingers 22 to blunt the fingers 22 and minimize catching of the tips 16 on surface imperfections in the first body.

Figure 2:
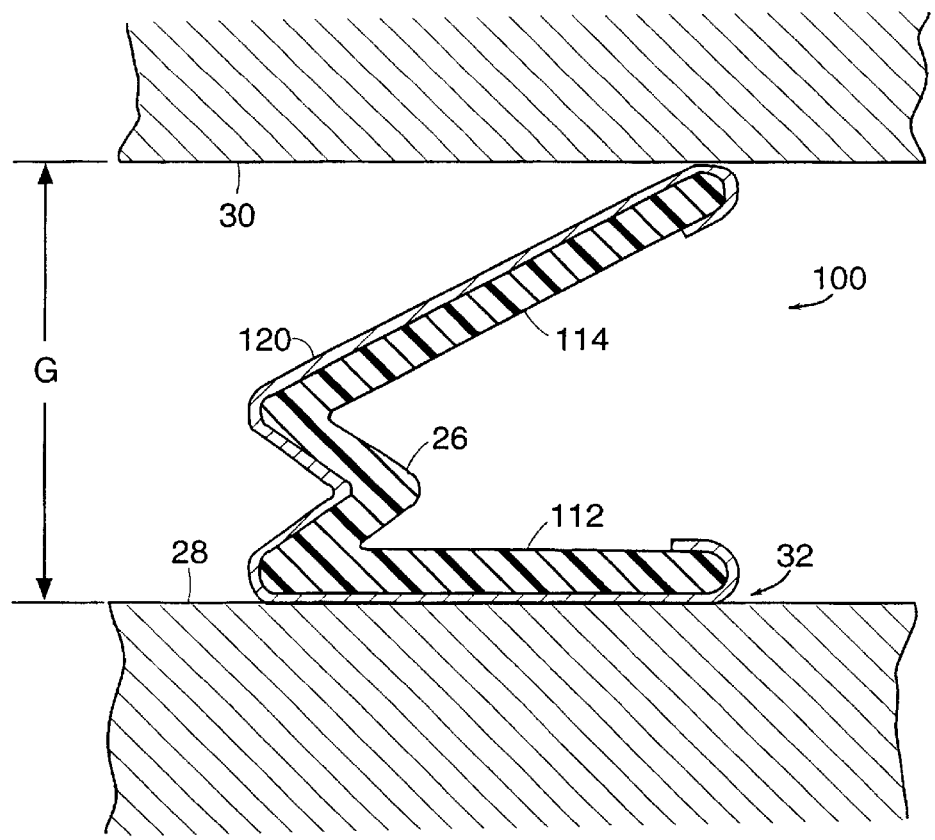
FIG. 2 is a schematic sectional view of an EMI shield disposed in a gap in accordance with a another embodiment of the present invention.

Instead of having a compressive arcuate profile 14, an EMI shield 100 may have a substantially planar profile 114 attached to a substantially planar base 112 by a hinge 26 in a cantilevered configuration so that the EMI shield 100 resembles a recumbent "W" as depicted in FIG. 2. A metallized fabric 120 envelops the entire exterior surface of the EMI shield 100 and wraps around respective tips of both the base 112 and profile 114. The base 112 may be attached to a first body 28 by a thin layer of adhesive 32 along a portion thereof to retain the EMI shield 100 in a predetermined position. The adhesive 32 may be electrically conductive. As a second body 30 moves relative to the first body 28 varying the width of a gap G formed therebetween, the hinge 26 elastically deforms to keep the profile 114 in contact therewith. The V-shaped configuration of the hinge 26 is designed to accommodate a relatively large range of motion between the first and second bodies 28, 30 while maintaining contact for electrical ground and shielding purposes; however, any of a variety of hinge configurations may be used. While the fabric 120 is depicted as being bonded to the entire exterior surface of the EMI shield 100, for ease of manufacture the fabric 120 need not be bonded to the hinge 26. A sufficient amount of fabric 120 should be provided in the area of the hinge 26, however, so as not to restrict the full range of compression of the EMI shield 100.

Figure 3:
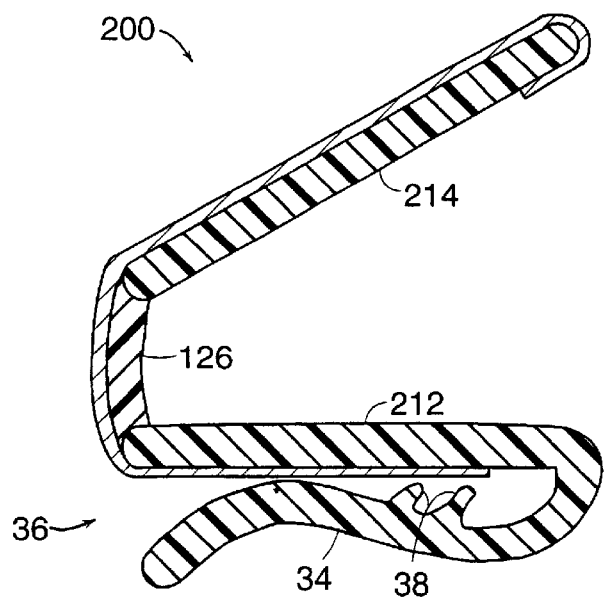
FIG. 3 is a schematic sectional view of an EMI shield in an uninstalled state in accordance with yet another embodiment of the present invention.

In this EMI shield 100, all of the base 112, the hinge 26 and the profile 114 are manufactured from the same polymer material; however, different materials with different material properties may be used as depicted in FIG. 3. The EMI shield 200 includes a substantially planar profile 214 which forms an acute angle with a substantially planar base 212 in a cantilevered configuration so that the EMI shield 200 resembles a recumbent "U". Instead of terminating at a tip, however, the base 212 includes a return 34 which forms a throat 36 to permit mounting the EMI shield 200 on a planar flange of the first body. The return includes barbing 38 directed into the throat 36 to stabilize the EMI shield 200 once installed on the flange. The return 34 could alternatively be configured for insertion into a slot in the first body. Barbing 38 extending in opposing directions from both sides of the return may be used to stabilize the EMI shield 200 in such a configuration.

The profile 214 is attached to the base 212 by a hinge 126, but instead of being manufactured from the material used to make the base 212 and the profile 214, the hinge 126 may be manufactured of a more flexible material resistant to fatigue failure to extend the life of the EMI shield 200. A metallized fabric 220 envelops the entire exterior surface of the EMI shield 200, wrapping around the tip of profile 214 and extending into the throat 36 to provide a electrical ground path between the first and second bodies. While the fabric 220 is depicted as being bonded to the entire exterior surface of the EMI shield 200, the fabric 220 need not be bonded to the hinge 126. A sufficient amount of fabric 220 should be provided in the area of the hinge 126, however, so as not to restrict the full range of compression of the EMI shield 200.

Figure 4:
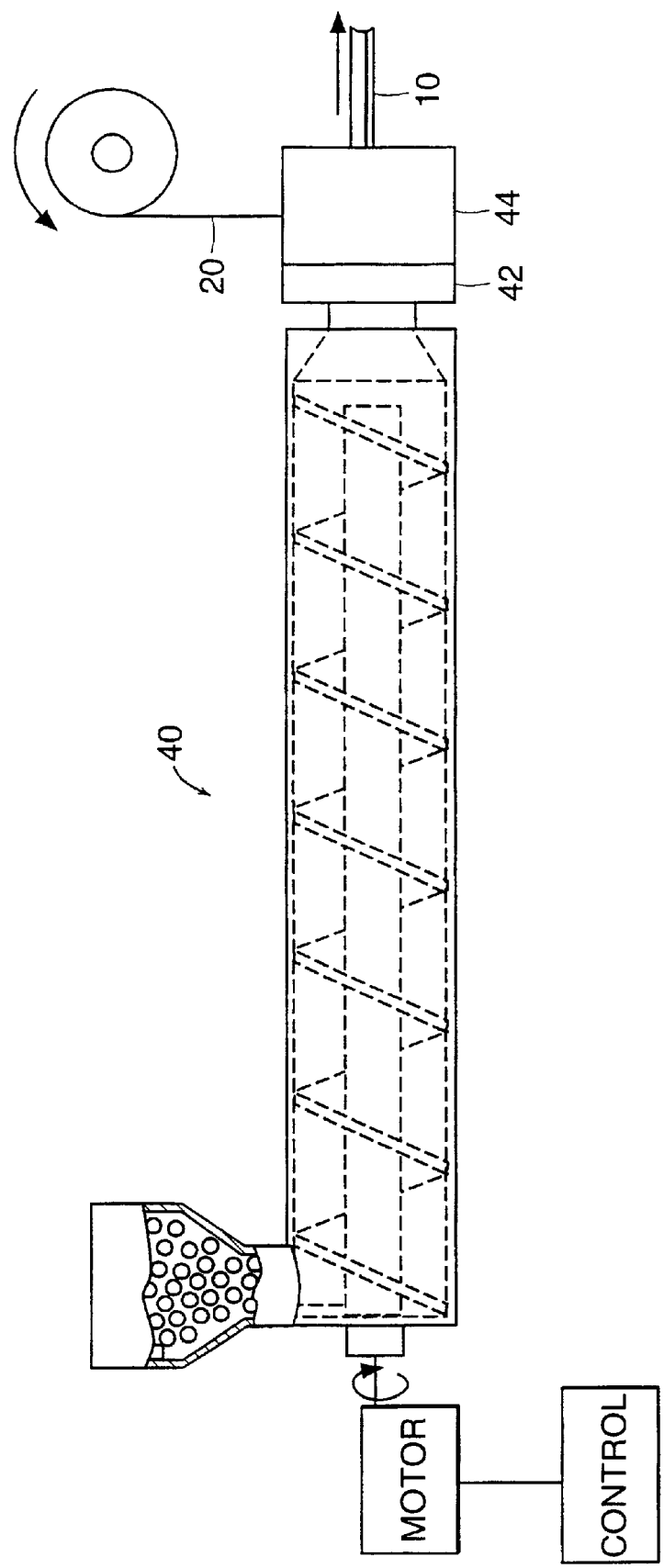
FIG. 4 is a schematic block diagram representation of a method of manufacture of an EMI shield by extrusion in accordance with one embodiment of the present invention.

A cost effective method of manufacture of the various EMI shields is by continuous extrusion of one or more selected polymers using a screw extruder 40 having a die 42 with the desired shape of the cross-section of the shield 10 as depicted schematically in FIG. 4. In one embodiment, the shield 10 may be manufactured from high temperature rated PVC for flame retardancy, although any electrically nonconductive material with a suitable modulus of elasticity may be employed. Flame retardancy is desirable, however, since such EMI shields can be approved for installation in safety certified electronic equipment enclosures. If a more flexible hinge is desired, a compatible material such as polyester can be coextruded with the profile and base to form the hinge. A suitable polyester hinge material is Hytrel™, available from DuPont located in Wilmington, Del. Techniques of coextrusion are well known to those skilled in the art of polymer processing.

Once the polymer portion of the EMI shield 10 has been formed to the desired configuration, an electrically conductive layer is disposed on the profile 14 and any other portion of the EMI shield 10 desired. One method employs a metallized fabric 20 in tape form of suitable width backed with a thermally activated glue. The glue may cover substantially the entire backing or solely portions thereof such as along the edges. In a process known to those skilled in the art as in-line crosshead extrusion, as the polymer is being extruded through the die 42, the hot extrusion passes through a second die 44 in which the metallized fabric tape 20 is mated thereto. The thermal energy in the extrusion and the second die 44 activates the glue, bonding the metallized fabric 20 to the profile 14. Alternatively, the metallized fabric 20 can be disposed on the extrusion in a separate operation, such as by passing the formed polymer and metallized fabric tape 20 through a heated die after the polymer has been cut to a desired length.

As used herein, the term metallized fabrics include articles having one or more metal coatings disposed on woven, nonwoven, or open mesh carrier backings and equivalents thereof. See, for example, U.S. Pat. No. 4,900,618 issued to O'Connor et al., U.S. Pat. No. 4,901,072 issued to Morgan et al.; U.S. Pat. No. 5,075,037 issued to Morgan et al., and U.S. Pat. No. 5,393,928 issued to Cribb et al., the disclosures of which are herein incorporated by reference. Metallized fabrics are commercially available in a variety of metal and fabric carrier backing combinations. For example, pure copper on a nylon carrier, nickel-copper alloy on a nylon carrier, and pure nickel on a polyester mesh carrier are available under the registered trademark Flectron® from Advanced Performance Materials located in St. Louis, Mo. An aluminum foil on a polyester mesh carrier is available from Neptco, located in Pawtucket, R. I. Other suitable metals include silver and tin. The choice of metal is guided, in part, by installation conditions of the EMI shield. For example, a particular metal might be chosen due to the composition of abutting body metal in the enclosure to avoid galvanic corrosion of the EMI shield which could increase electrical resistance and deteriorate electrical grounding performance. Metallized tapes are desirable both for ease of application as well as durability. Deposition of a metal layer directly on the polymer profile would wear away relatively quickly due to friction when compared to the metallized fabrics.

Once the metallized fabric has been bonded to the EMI shield, other features can be formed. For example, the EMI shield may pass through rotary drilling, stamping, or piercing tools to divide the profile into independently flexible fingers or create apertures in the base for mounting the shield. The EMI shield can be cut to the desired length before or after these finishing operations.

Instead of forming the polymer and then applying the metallized fabric, according to some embodiments of the present invention, the metallized fabric can be first bonded to either flat or preformed polymer sheet stock. Then, the sheet stock can be thermoformed to a final predetermined configuration by as known by those skilled in the art. Thermoforming can be accomplished on discrete pieces of sheet stock in a heated die or continuously by passing the sheet stock through heated rollers to produce the desired configuration. Additional manufacturing steps such as generating the mounting apertures or dividing the profile into fingers can be accomplished prior to, during, or after thermoforming, as desired.

By relying on the metallized fabric to provide an electrically conductive path and the underlying polymer to provide elastic compliancy and resiliency, lower electrical resistance is achievable since beryllium is not required to be added to copper for toughness. As a result, the electrical conductivity and the resultant EMI shielding capability of the EMI shield according to this invention is improved over conventional copper beryllium finger strips. Further, the polymer portion of the shield is less brittle than all metal copper beryllium finger strips, resulting in reduced handling and installation damage to the EMI shield, improved safety, and extended service life.

In an exemplary embodiment, the thickness of an EMI shield profile according to the invention may be between about 0.13 mm (0.005 inches) or less and about 01.5 mm (0.060 inches) or more. In a preferred embodiment, the thickness of the EMI shield profile may be between about 0.25 mm (0.010 inches) or less and about 1.0 mm (0.04 inches) or more. The metallized fabric may have a thickness between about 0.1 mm (0.004 inches) or less and about 0.5 mm (0.02 inches) or more. These ranges are considered exemplary in nature and specific dimensions for a particular application would depend on the mechanical properties of the polymer material selected for the profile and hinge, the overall configuration of the EMI shield, and the electrical properties of the metallized fabric. Accordingly, values outside these ranges are considered to be within the scope of the invention.

Figure 5A:
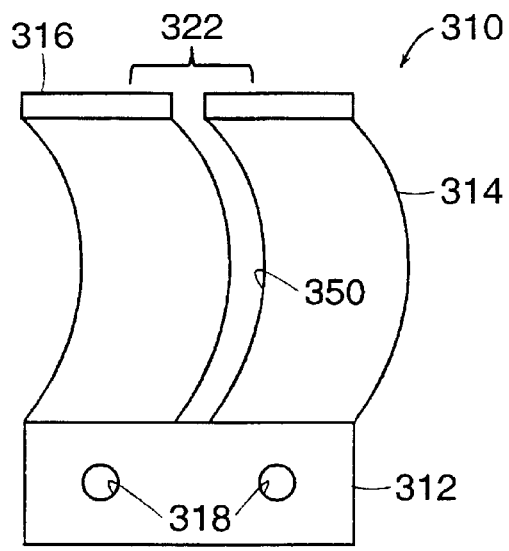
FIG. 5A is a schematic plan view of an EMI finger shield with non-linear arcuate fingers forming arcuate slits in accordance with one embodiment of the present invention.

An improved method of EMI shielding can be achieved by modifying the configuration of the EMI shield fingers. Instead of dividing the profile 14 of the EMI shield 10 into rectangularly shaped independent fingers 22, according to some embodiments of the present invention, the profile 14 may be divided into fingers of other nonlinear shapes. As depicted in FIG. 5A, an EMI shield 310 having a profile 314 may be divided into arcuate-shaped, independently flexible fingers 322, which form nonlinear arcuate slits 350 therebetween. The width of the slits depicted in the figures is exaggerated to facilitate depiction. In practice, slit width can be substantially zero, with the profile being cut only, without the removal of any material. By dividing the profile 314 into non-rectangular fingers, the EMI shield 310 can provide improved EMI shielding, because an EMI transmission in a given direction cannot be aligned with the entire slit length from the base 312 to the tip 316. As with the EMI shield 10 with the independently flexible fingers 22 of rectangular shape depicted in FIG. 1A, the EMI shield 310 with arcuate shaped independently flexible fingers 322 shown in FIG. 5A may also include the other features, such as apertures 318 in a base 312 thereof and an offset tip 316.

Figure 5B:
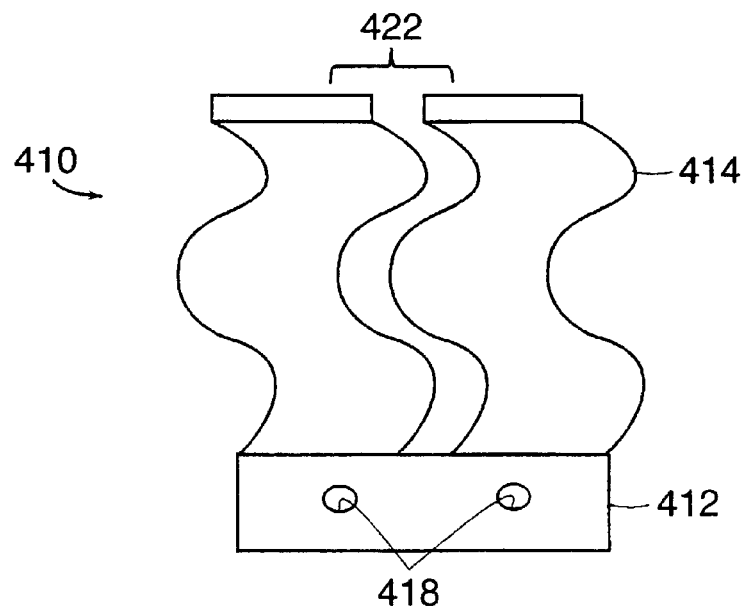
FIG. 5B is a schematic plan view of an EMI finger shield with non-linear sinusoidal fingers forming sinusoidal slits in accordance with another embodiment of the present invention.

Instead of having arcuate-shaped independently flexible fingers 322, an EMI shield 410 may be a version thereof, and have a profile 414 divided into sinusoidal-shaped independently flexible fingers 422, as depicted in FIG. 5B. The EMI shield 410 with sinusoidal-shaped independently flexible fingers 422 also may include a base 412 and apertures 418 formed therein. The radius or radii of curvature of the arcuate and sinusoidal fingers 322, 422 may be selected, as desired, to minimize the passage of EMI waves therethrough, as discussed hereinabove.

Figure 6A:
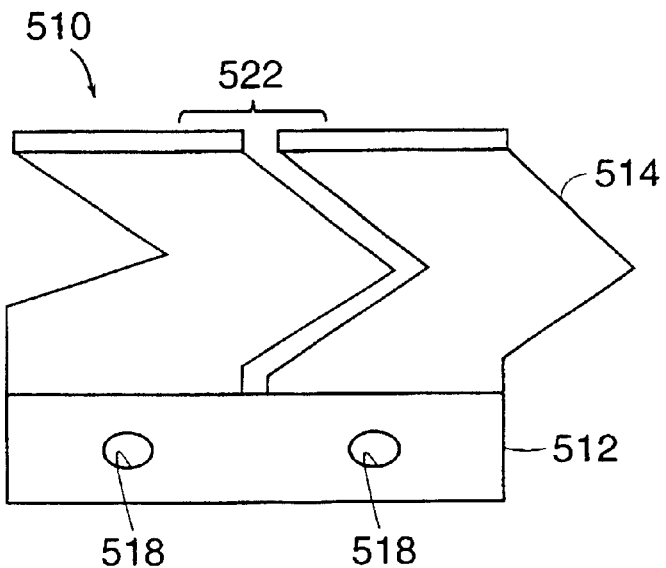
FIG. 6A is a schematic plan view of an EMI finger shield with non-linear chevron fingers forming chevron slits in accordance with yet another embodiment of the present invention.

An EMI shield 510 with a profile 514 may be divided into chevron-shaped independently flexible fingers 522 as depicted in FIG. 6A. A base 512 may form apertures 518. Alternatively, an EMI shield 610 may be a version thereof, with a profile 614 being divided into zigzag shaped independently flexible fingers 622 as depicted in FIG. 6B, with an associated base 612 and apertures 618.

Figure 7A:
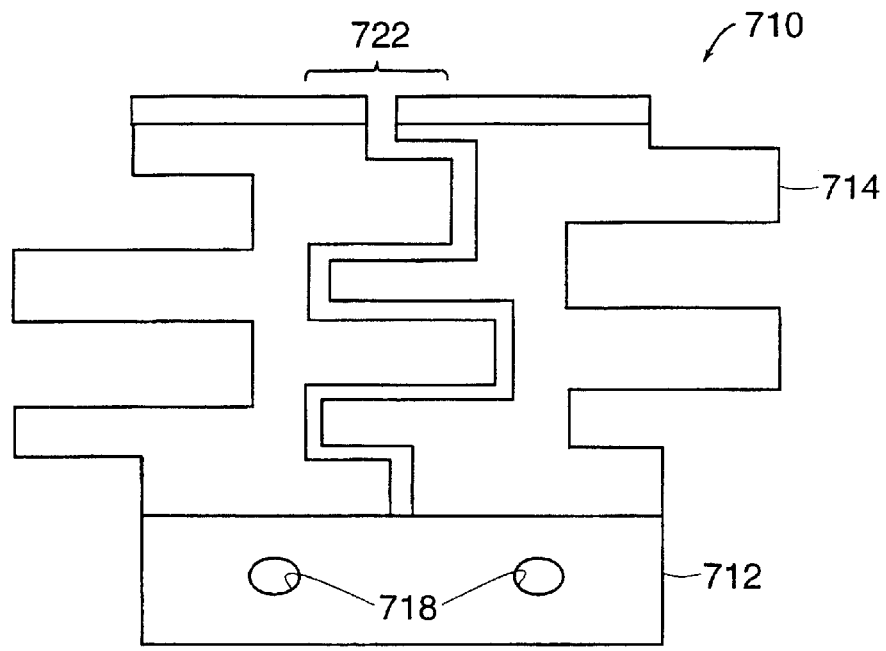
FIG. 7A is a schematic plan view of an EMI finger shield with non-linear interdigitated fingers forming corresponding slits in accordance with yet still another embodiment of the present invention.

An EMI shield 710 with a profile 714 may also be divided into more complex shapes, such as independently flexible interdigitated fingers 722 as depicted in FIG. 7A, with a base 712 and apertures 718.

Figure 6B:
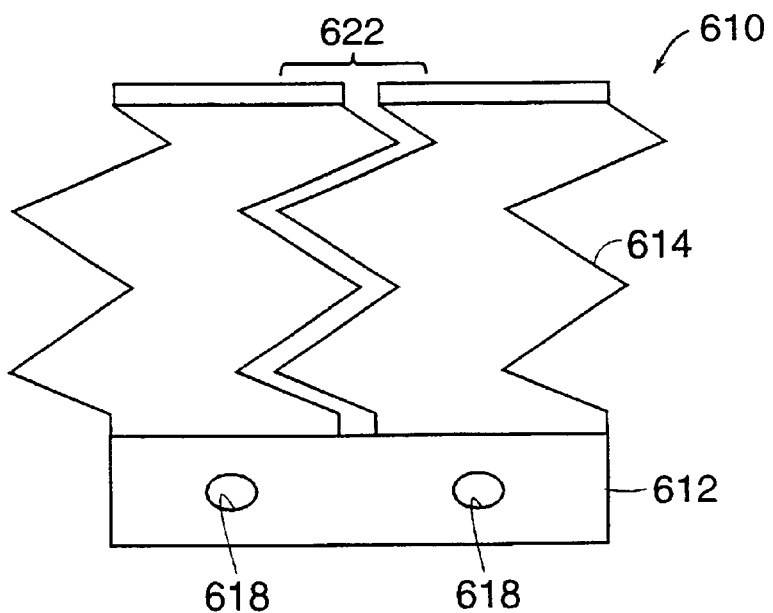
FIG. 6B is a schematic plan view of an EMI finger shield with non-linear zigzag fingers forming zigzag slits in accordance with still another embodiment of the present invention.
Figure 7B:
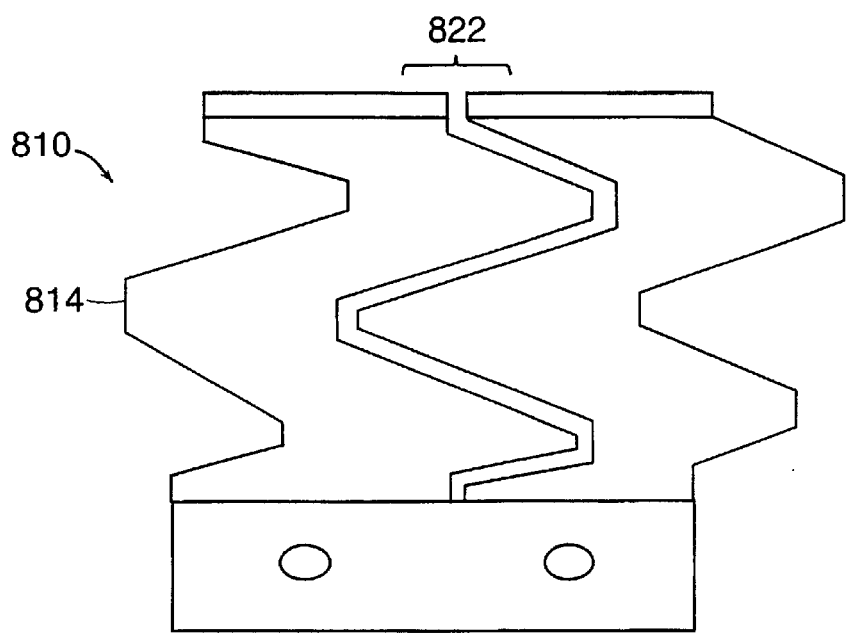
FIG. 7B is a schematic plan view of an EMI finger shield with non-linear interdigitated fingers forming corresponding slits in accordance with still a further embodiment of the present invention.

Lastly, as depicted in FIG. 7B, an EMI shield 810 with a profile 814 may combine the features of other fingers, such as the zigzag fingers 622 of FIG. 6B and the generally rectangularly interdigitated fingers 722 of FIG. 7A to form independently flexible interdigitated fingers 822 with tapered portions.

The EMI finger shields having fingers of non-rectangular shape may be manufactured according to any method and with any material, including electrically conductive materials, such as copper beryllium alloy, as well as metallized fabric clad polymers.

While there have been described herein what are to be considered exemplary and preferred embodiments of the present invention, other modifications of the invention will become apparent to those skilled in the art from the teachings herein. For example, instead of the fingers being arcuate or planar, more complex contours such as partially twisted fingers may be created by thermoforming when the profile is divided into fingers or thereafter. Additionally, the invention is not limited to linear EMI shields, but rather includes shaped EMI shields such as those in the form of annuli and other closed or open curves required for specific applications. Still further, the non-linear slits formed between adjacent fingers may be any combination of the shapes disclosed herein, as well as other geometries and variants thereof. For example, the slits may be chevron-shaped proximate the base and arcuate proximate the tip. Moreover, the non-linear slits may be formed in any EMI finger shield, irrespective of the method of attachment to the enclosure to be shielded. For example, the shield base may be bonded to the enclosure or may include a return with barbing to attach to an enclosure flange. In general, all combinations and permutations of the EMI shields disclosed herein are considered to be within the scope of the invention. The particular methods of manufacture of and geometries disclosed herein are exemplary in nature and are not to be considered limiting.

It is therefore desired to be secured in the appended claims all such modifications as fall within the spirit and scope of the invention. Accordingly, what is desired to be secured by Letters Patent is the invention as defined and differentiated in the following claims.

What is claimed is:

1. A shield for shielding electromagnetic interference from passing through a seam between a first electrically conductive body and a second electrically conductive body, the shield comprising:

a base for securing the shield to the first body; and a plurality of generally independently flexible fingers attached to the base for contacting the second body, wherein the plurality of fingers form nonlinear slits therebetween.

2. A shield according to claim 1 wherein the fingers are electrically conductive.

3. A shield according to claim 2 wherein the fingers comprise a copper beryllium alloy.

4. A shield according to claim 1 wherein the base and fingers are formed integrally.

5. A shield according to claim 1 wherein:

the fingers are electrically nonconductive; and the shield further comprises an electrically conductive layer disposed on the fingers.

6. A shield according to claim 5 wherein the electrically conductive layer comprises a metallized fabric bonded to the fingers.

7. A shield according to claim 1 wherein the fingers are attached to the base by a hinge.

8. A shield according to claim 1 further comprising an adhesive strip attached to the base.

9. A shield according to claim 1 wherein the base includes a return.

10. A shield according to claim 9 wherein the return includes barbing.

11. A shield according to claim 1 wherein the formed nonlinear slits are selected from the group consisting of arcuate slits, interdigitated slits, chevron-shaped slits, and combinations thereof.

\* \* \* \* \*